(12) United States Patent
Kang

(10) Patent No.: US 9,349,956 B2
(45) Date of Patent: May 24, 2016

(54) LAMINATING APPARATUS AND METHOD OF MANUFACTURING ORGANIC LIGHT-EMITTING DISPLAY USING THE SAME

(71) Applicant: Samsung Display Co., Ltd., Yongin, Gyeonggi-Do (KR)

(72) Inventor: Jin Koo Kang, Cheonan-si (KR)

(73) Assignee: Samsung Display Co., Ltd., Yongin-si, Gyeonggi-Do (KR)

( * ) Notice: Subject to any disclaimer, the term of this patent is extended or adjusted under 35 U.S.C. 154(b) by 352 days.

(21) Appl. No.: 13/936,796

(22) Filed: Jul. 8, 2013

(65) Prior Publication Data

US 2014/0224415 A1     Aug. 14, 2014

(30) Foreign Application Priority Data

Feb. 8, 2013  (KR) .................. 10-2013-0014679

(51) Int. Cl.
| | |
|---|---|
| *H01L 51/00* | (2006.01) |
| *H01L 21/68* | (2006.01) |
| *H05B 3/26* | (2006.01) |
| *B32B 37/14* | (2006.01) |
| *H01L 21/67* | (2006.01) |

(Continued)

(52) U.S. Cl.
CPC ...... *H01L 51/0013* (2013.01); *H01L 21/67103* (2013.01); *H01L 21/67259* (2013.01); *H01L 51/56* (2013.01); *H05B 3/26* (2013.01); *Y10T 156/1705* (2015.01)

(58) Field of Classification Search
CPC ............. H01L 51/0013; H01L 51/05; H01L 21/67103; H01L 21/67259; Y10T 156/1705; H05B 3/26

USPC ............... 156/247, 321, 379.9, 583.1
See application file for complete search history.

(56) References Cited

U.S. PATENT DOCUMENTS

| | | | | |
|---|---|---|---|---|
| 5,918,098 | A | * 6/1999 | Van Bennekom . | G03G 15/2057 219/216 |
| 6,085,059 | A | * 7/2000 | Haneda ............. | G03G 15/2057 399/333 |

(Continued)

FOREIGN PATENT DOCUMENTS

| | | |
|---|---|---|
| KR | 1020110129001 A | 12/2011 |
| KR | 1020120083686 A | 7/2012 |

(Continued)

OTHER PUBLICATIONS

English translation of KR2012083686A.*

(Continued)

*Primary Examiner* — Sonya Mazumdar
(74) *Attorney, Agent, or Firm* — Robert E. Bushnell, Esq.

(57) ABSTRACT

In a laminating apparatus and a method of manufacturing an organic light-emitting display, the laminating apparatus includes a heater which generates heat and the heating member which transfers heat received from the heater to a donor film. The heating member includes a first conducting layer which receives heat from the heater, a second conducting layer which is formed on the first conducting layer and which has a thermal conductivity different from that of the first conducting layer, and a third conducting layer which is formed on the second conducting layer and which has a thermal conductivity different from that of the second conducting layer.

24 Claims, 8 Drawing Sheets

(51) Int. Cl.
  *B32B 37/26* (2006.01)
  *B32B 38/18* (2006.01)
  *H01L 51/56* (2006.01)

(56) References Cited

U.S. PATENT DOCUMENTS

| | | | | |
|---|---|---|---|---|
| 2002/0195928 A1* | 12/2002 | Grace | ............. | G02F 1/1341 313/503 |
| 2003/0059226 A1* | 3/2003 | Iida | ............. | G03G 15/10 399/101 |
| 2007/0096631 A1* | 5/2007 | Sung | ............. | G02F 1/1339 313/498 |
| 2009/0186148 A1 | 7/2009 | Kim et al. | | |
| 2013/0005066 A1 | 1/2013 | Sun et al. | | |

FOREIGN PATENT DOCUMENTS

| | | |
|---|---|---|
| KR | 1020120084147 A | 7/2012 |
| KR | 1020130007108 A | 1/2013 |

OTHER PUBLICATIONS

English translation of KR20110063651.*
English translation of KR1020110129001.*
English translation of KR1020120084147.*
English translation of KR1020130007108.*

\* cited by examiner

210

600

LAMINATING APPARATUS AND METHOD OF MANUFACTURING ORGANIC LIGHT-EMITTING DISPLAY USING THE SAME

CLAIM OF PRIORITY

This application makes reference to, incorporates into this specification the entire contents of, and claims all benefits accruing under 35 U.S.C. §119 from an application earlier filed in the Korean Intellectual Property Office on Feb. 8, 2013 and there duly assigned Serial No. 10-2013-0014679.

BACKGROUND OF THE INVENTION

1. Field of the Invention

The present invention relates to a laminating apparatus and a method of manufacturing an organic light-emitting display using the same, and more particularly, to a laminating apparatus for laminating a donor film and a method of manufacturing an organic light-emitting display using the laminating apparatus.

2. Description of the Related Art

The most common method of forming a pixel in an organic electroluminescent device, which is a flat panel display, is to form a light-emitting layer only in a desired area by aligning a fine metal mask (FMM) with a substrate within a vacuum chamber and sublimating a small-molecule organic light-emitting material to be deposited. The FMM method is not easily applicable to a large area pixel due to the weight of a mask frame, the difficulty of mask stretching, drooping of the mask itself, expansion caused by temperature, etc. Accordingly, there has been a need for a new concept of process technology for forming a large-area pixel in an organic electroluminescent device. Representative methods being researched to replace a method of forming red, green and blue light-emitting layers individually using the conventional FMM include a laser induced thermal imaging (LITI) method, an inkjet method of a solution process, and a white organic light-emitting diode (OLED) and color filter method. In particular, laser technology represented by the LITI method and laser induced pattern-wise sublimation (LIPS) or radiation induced sublimation transfer (RIST) is a technology for forming a pixel by transferring a transfer layer, formed in advance in a donor film or substrate, to an acceptor substrate by irradiating a laser beam to the donor film or substrate.

In the LITI method, after a donor film is placed on an acceptor substrate, the donor film and the acceptor substrate are laminated. Then, laser transfer is performed on the donor film.

SUMMARY OF THE INVENTION

Aspects of the present invention provide a laminating apparatus which can reduce the formation of cracks in an acceptor substrate during the peeling off of a donor film by lowering a process temperature.

Aspects of the present invention also provide a method of manufacturing an organic light-emitting display, in which a donor film can be separated from an acceptor substrate with improved reliability.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a laminating apparatus which includes a heater which generates heat and a heating member which transfers heat received from the heater to a donor film. The heating member includes a first conducting layer which receives heat from the heater, a second conducting layer which is formed on the first conducting layer and which has a thermal conductivity different from that of the first conducting layer, and a third conducting layer which is formed on the second conducting layer and which has a thermal conductivity different from that of the second conducting layer.

According to another aspect of the present invention, there is provided a laminating apparatus which includes a heater which generates heat and a plurality of heating members which transfer heat received from the heater to a donor film. The plurality of heating members include a first conducting layer which receives heat from the heater, a second conducting layer which is formed on the first conducting layer and which has a thermal conductivity different from that of the first conducting layer, and a third conducting layer which is formed on the second conducting layer and has a thermal conductivity different from that of the second conducting layer.

According to another aspect of the present invention, there is provided a method of manufacturing an organic light-emitting display which includes patterning a transfer layer of a donor film, placing the donor film on an acceptor substrate, laminating the acceptor substrate and the donor film, transferring the transfer layer of the donor film to the acceptor substrate, and removing the donor film from the acceptor substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
FIG. 1 is a cross-sectional view of a heating member included in a laminating apparatus according to an embodiment of the present invention.

The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims.

As used herein, the term "on" or "above" may be used for ease of description to describe the relationship of one element to another element(s) as illustrated in the figures. The term "on" or "above" can be interpreted as "under" or "below" depending on the arrangement of elements or viewing angle.

The term "on" that is used to designate that an element is on another element or located on a different layer or a layer includes both a case where an element is located directly on another element or a layer and a case where an element is located on another element via another layer or still another element. In the entire description of the present invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims.

Laminating apparatuses according to embodiments of the present invention will hereinafter be described with reference to the attached drawings.

FIG. 1 is a cross-sectional view of a heating member 100 included in a laminating apparatus according to an embodiment of the present invention.

Figure 2:
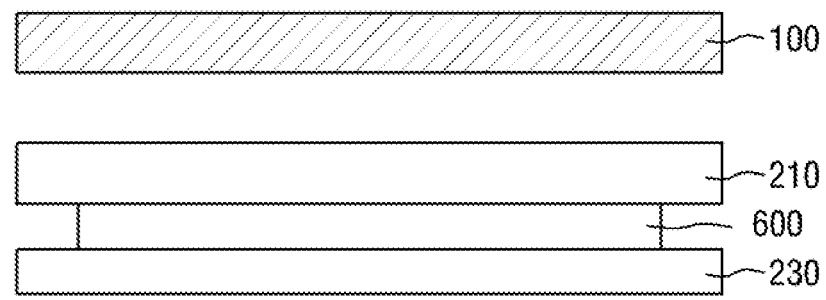
FIG. 2 is a cross-sectional view of the heating member, a donor film, an acceptor substrate, and a bottom film according to an embodiment of the present invention.

Referring to FIG. 1, the laminating apparatus according to the current embodiment includes a heater which generates heat, and the heating member 100 which transfers heat received from the heater to a donor film 210 (see FIG. 2). The heating member 100 includes a first conducting layer 10 which receives heat from the heater, a second conducting layer 20 which is formed on the first conducting layer 10 and which has a thermal conductivity different from that of the first conducting layer 10, and a third conducting layer 30 which is formed on the second conducting layer 20 and which has a thermal conductivity different from that of the second conducting layer 20.

The heater serves as a heat source which provides heat to the laminating apparatus. Specifically, the heater may provide heat to the heating member 100. More specifically, the heater may provide heat to the first conducting layer 10 of the heating member 100. The heat transfer method is not particularly limited. In an example, the heater may directly contact the first conducting layer 10 to transfer heat by conduction.

The first conducting layer 10 may transfer heat received from the heater to the second conducting layer 20. For easy heat transfer, the first conducting layer 10 may include a metal. For example, the first conducting layer 10 may include gold, silver, copper, aluminum, or stainless steel.

The second conducting layer 20 may be disposed on the first conducting layer 10. The second conducting layer 20 may have a thermal conductivity different from that of the first conducting layer 10. For example, the second conducting layer 20 may have a lower thermal conductivity than the first conducting layer 10. When heat generated by the heater is transferred to the second conducting layer 20 via the first conducting layer 10, the temperature of the second conducting layer 20 may be relatively lower than that of the first conducting layer 10.

The second conducting layer 20 may include a heat insulating material. The heat insulating material included in the second conducting layer 20 may be plastic. An example of the plastic employed as the heat insulating material may be polyetheretherketone (PEEK).

The second conducting layer 20 can be replaced by a heat insulating sheet. In a case where the second conducting layer 20 is replaced by the heat insulating sheet, the second conducting layer 20 may be thinner than the first conducting layer 10. In an exemplary embodiment, the heat insulating sheet may be a Teflon sheet.

The third conducting layer 30 may be disposed on the second conducting layer 20. The third conducting layer 30 may have a thermal conductivity different from that of the second conducting layer 20. For example, the thermal conductivity of the third conducting layer 30 may be higher or lower than that of the second conducting layer 20. However, the thermal conductivity of the third conducting layer 30 may be equal to that of the first conducting layer 10. That is, the first conducting layer 10 and the third conducting layer 30 may be formed of the same material.

The third conducting layer 30 may include a metal. For example, the third conducting layer 30 may include gold, silver, copper, aluminum, or stainless steel. However, the present invention is not limited thereto, and the third conducting layer 30 may also include a heat insulating material.

The heat insulating material included in the third conducting layer 30 may be plastic. For example, the heat insulating material may include PEEK.

Heat generated by the heater may be transferred to the third conducting layer 30 via the first conducting layer 10 and the second conducting layer 20. Since the heat is transferred to the third conducting layer 30 via the first conducting layer 10 and the second conducting layer 20, the temperature of the third conducting layer 30 may be relatively lower than those of the first conducting layer 10 and the second conducting layer 20.

FIG. 2 is a cross-sectional view of the heating member, the donor film, an acceptor substrate, and a bottom film according to an embodiment of the present invention.

Referring to FIG. 2, the heating member 100 is placed adjacent to the donor film 210. The heating member 100 may contact the donor film 210 in a lamination process.

Specifically, the third conducting layer 30 of the heating member 100 may contact the donor film 210 in the lamination process. When the third conducting layer 30 of the heating member 100 contacts the donor film 210, it may transfer heat to the donor film 210, thereby heating the donor film 210.

In the lamination process according to an embodiment of the present invention, the donor film 210 may be placed on the acceptor substrate 600. Specifically, the bottom film 230 may be provided, the acceptor substrate 600 may be placed on the bottom film 230, and the donor film 210 may be placed on the acceptor substrate 600.

The bottom film 230 may be placed under the acceptor substrate 600 and may be adhered to the donor film 210 in the lamination process.

Figure 3:
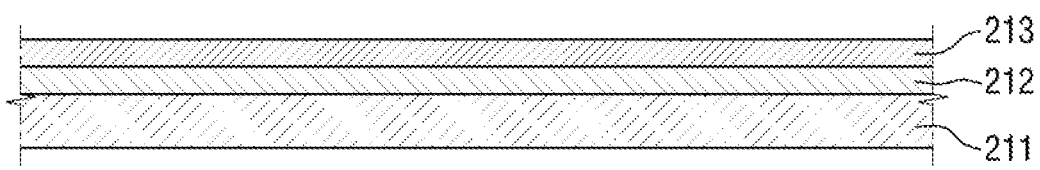
FIG. 3 is a cross-sectional view of the donor film included in the laminating apparatus according to an embodiment of the present invention.

FIG. 3 is a cross-sectional view of the donor film included in the laminating apparatus according to an embodiment of the present invention.

Referring to FIG. 3, the donor film 210 may include a base film 211, a photothermal conversion layer 212, and a transfer layer 213. The base film 211 may be formed of a transparent polymer organic material such as polyethylene terephthalate (PET), polyethylene naphthalate (PEN), polyethylene (PE) or polycarbonate (PC). The photothermal conversion layer 212 converts incident light into heat, and may include a light-absorbing material such as aluminum oxide, aluminum sulfide, carbon black, graphite, or infrared dye. The transfer layer 213 may include a material to be transferred to the acceptor substrate 600 of FIG. 2. According to an embodiment of the present invention, the transfer layer 213 may be an organic transfer layer. The organic transfer layer may include at least one layer selected from the group consisting of a hole injection layer, a hole transport layer, an electroluminescent layer, a hole blocking layer, an electron transport layer, and an electron injection layer. A light-emitting layer may be formed on the acceptor substrate 600 by the transfer of the transfer layer 213.

In an embodiment of the present invention, a laser beam is irradiated directly onto the transfer layer 213 of the donor film 210 in order to pattern the transfer layer 213. Therefore, during the patterning process, only the transfer layer 213 should be removed, and the base film 211 and the photothermal conversion layer 212 should be left undamaged. To this end, other elements of the donor film 210, excluding the transfer layer 213, may be formed of a material having a tolerance to a wavelength range of a laser beam used to remove the transfer layer 213 so that the elements are not damaged by the laser beam. In an example, if a UV laser beam is used to remove the transfer layer 213, other elements excluding the transfer layer 213 may be formed of an anti-UV material.

The above-described structure of the donor film 210 is merely an example, and the scope of the present invention is not limited by the structure of the donor film 210. Specifically, a layer having a different function may also be interposed between the above-described layers.

Figure 4:
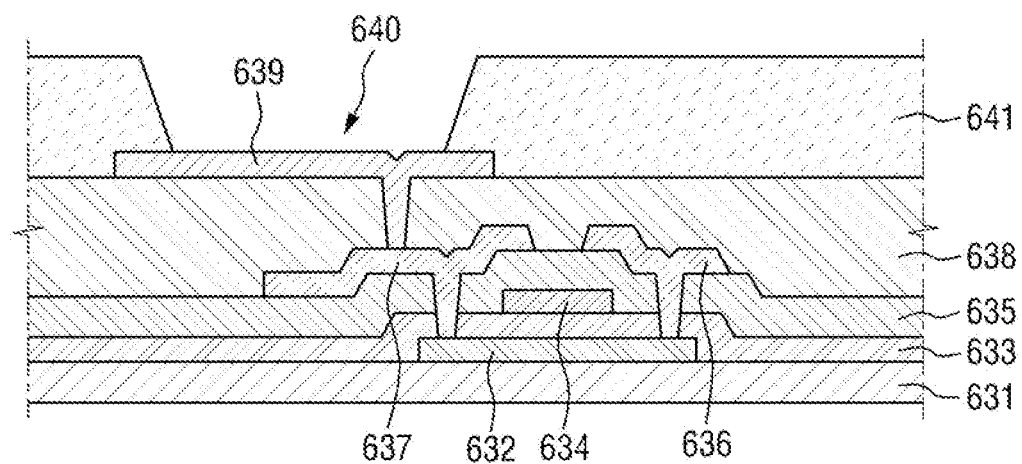
FIG. 4 is a cross-sectional view of the acceptor substrate according to an embodiment of the present invention.

FIG. 4 is a cross-sectional view of the acceptor substrate according to an embodiment of the present invention.

Referring to FIG. 4, the acceptor substrate 600 according to the current embodiment may be a substrate including an organic light-emitting diode (OLED).

In the acceptor substrate 600, a semiconductor layer 632 may be disposed on a predetermined region of a substrate 631. The semiconductor layer 632 may be an amorphous silicon layer or a polycrystalline silicon layer formed by crystallizing an amorphous silicon layer. A gate insulating layer 633, which is a first insulating layer, may be disposed on the semiconductor layer 632. A gate electrode 634, which overlaps the semiconductor layer 632, may be disposed on the gate insulating layer 633. A second insulating layer 635, which covers the semiconductor layer 632 and the gate electrode 634, may be disposed on the gate electrode 634. A source electrode 636 and a drain electrode 637, which pass through the second insulating layer 635 and the first insulating layer 633 and respectively contact both ends of the semiconductor layer 632, may be disposed on the second insulating layer 635.

The semiconductor layer 632, the gate electrode 634, and the source and drain electrodes 636 and 637, respectively, form a thin-film transistor T. A third insulating layer 638, which covers the source and drain electrodes 636 and 637, respectively, may be disposed on the source and drain electrodes 636 and 637, respectively. The third insulating layer 638 may be a passivation layer that protects the thin-film transistor T and/or a planarization layer that reduces surface unevenness due to the thin-film transistor T. A pixel electrode 639 may be disposed on the third insulating layer 638 and may pass through the third insulating layer 638 to contact the drain electrode 637. The pixel electrode 639 may be, for example, an indium tin oxide (ITO) layer or an indium zinc oxide (IZO) layer. A pixel defining layer 641 may be disposed on the pixel electrode 639 and has an opening 640 which partially exposes the pixel electrode 639.

Figure 5:
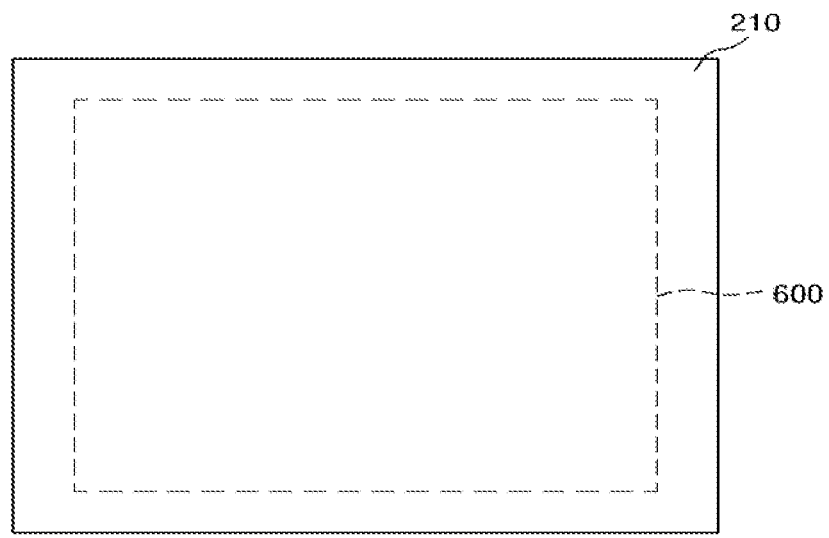
FIG. 5 is a plan view of the donor film shown in FIG. 3.

FIG. 5 is a plan view of the donor film shown in FIG. 3.

Referring to FIG. 5, the donor film 210 may completely cover the acceptor substrate 600.

In an exemplary embodiment, the area of the donor film 210 may be greater than that of the acceptor substrate 600. In this case, a portion of the donor film 210 along an outer circumference of the acceptor substrate 600 may not overlap the acceptor substrate 600.

The portion of the donor film 210 which does not overlap the acceptor substrate 600 may contact the bottom film 230 of FIG. 2 disposed under the acceptor substrate 600. The heating member 100 according to the current embodiment of the present invention may heat the portion of the donor film 210 which contacts the bottom film 230, thereby attaching the donor film 210 and the bottom film 230 to each other.

Other embodiments of the present invention will hereinafter be described. In the following embodiments, elements substantially identical to those of the previous embodiment are indicated by like reference numerals, and thus their description will be omitted or simplified.

Figure 6:
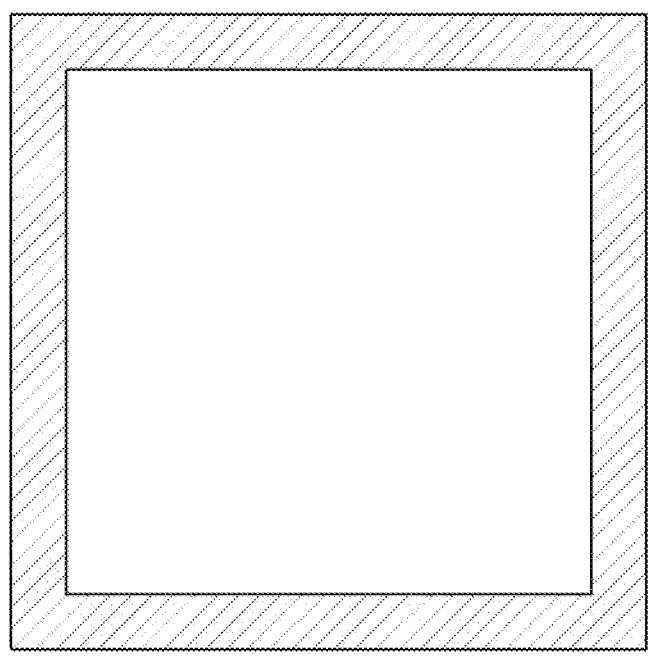
FIG. 6 is a plan view of a heating member according to another embodiment of the present invention.
Figure 7:
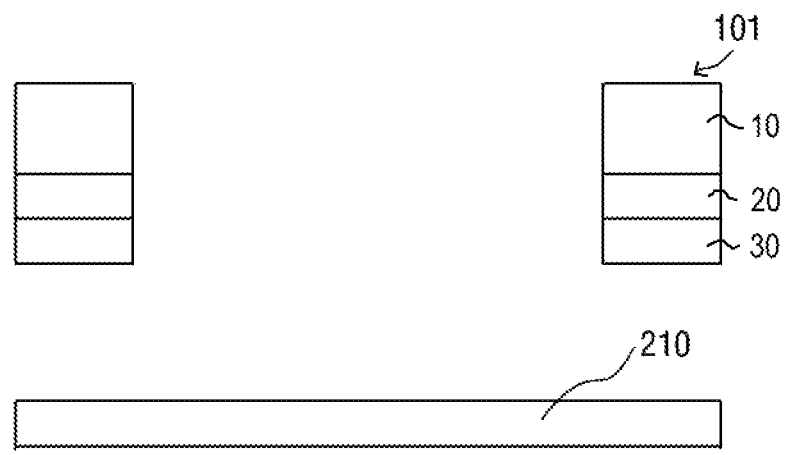
FIG. 7 is a cross-sectional view of the heating member shown in FIG. 6.

FIG. 6 is a plan view of a heating member according to another embodiment of the present invention. FIG. 7 is a cross-sectional view of the heating member shown in FIG. 6.

Referring to FIGS. 6 and 7, the heating member 101 according to the current embodiment is different from the heating member 100 according to the embodiment of FIG. 1 in that it is shaped like a quadrangle with a through hole.

As described above, the area of a donor film 210 may be greater than that of an acceptor substrate 600. In this case, a portion of the donor film 210 along an outer circumference of the acceptor substrate 600 may not overlap the acceptor substrate 600. The portion of the donor film 210 which does not overlap the acceptor substrate 600 may contact a bottom film 230 of FIG. 2 disposed under the acceptor substrate 600. In this case, the heating member 100 may heat the portion of the donor film 210 which contacts the bottom film 230, thereby attaching the donor film 210 to the bottom film 230.

The heating member 101 may have a quadrangular through hole. In an exemplary embodiment, the area of the through hole of the heating member 101 may be equal to the area of the acceptor substrate 600 used in a lamination process. In this case, the heating member 101 may directly heat only the portion of the donor film 201 along the outer circumference of the acceptor substrate 600, that is, the portion of the donor film 210 which contacts the bottom film 230.

The through hole may be formed in all of a first conducting layer 10, a second conducting layer 20 and a third conducting layer 30. That is, each of the first conducting layer 10, the second conducting layer 20 and the third conducting layer 30 may include a through hole. The through holes of the first through third conducting layers 10 through 30 may have the same size and shape and may completely overlap each other, as seen in a plan view. However, the through holes of the first through third conducting layers 10 through 30 may also have different sizes and/or shapes and may partially overlap each other.

Figure 8:
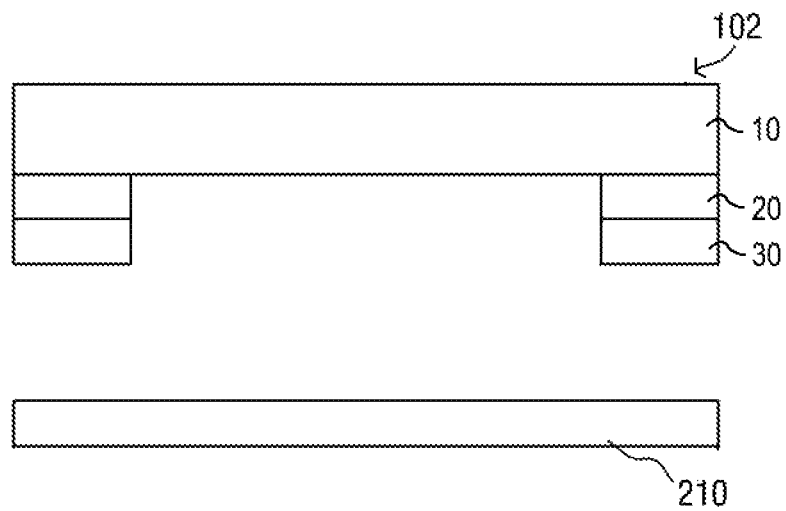
FIG. 8 is a cross-sectional view of a heating member according to another embodiment of the present invention.

FIG. 8 is a cross-sectional view of a heating member according to another embodiment of the present invention.

Referring to FIG. 8, the heating member 102 according to the current embodiment is different from the heating member 101 according to the embodiment of FIG. 7 in that a through hole is formed in a second conducting layer 20 and a third conducting layer 30.

As described above, the heating member 102 according to the current embodiment may have a quadrangular through hole.

The though hole may be formed in a first conducting layer 10, the second conducting layer 20 and the third conducting layer 30. However, a depth of the through hole is not limited. In FIG. 8, the through hole is formed only in the second conducting layer 20 and the third conducting layer 30. However, the present invention is not limited thereto, and the through hole may also be formed only in the third conducting layer 30. In addition, not a complete through hole but a recess may be formed in a portion of each conducting layer. For example, the third conducting layer 30 may have a complete through hole, and a portion of the second conducting layer 20 may be recessed.

Figure 9:
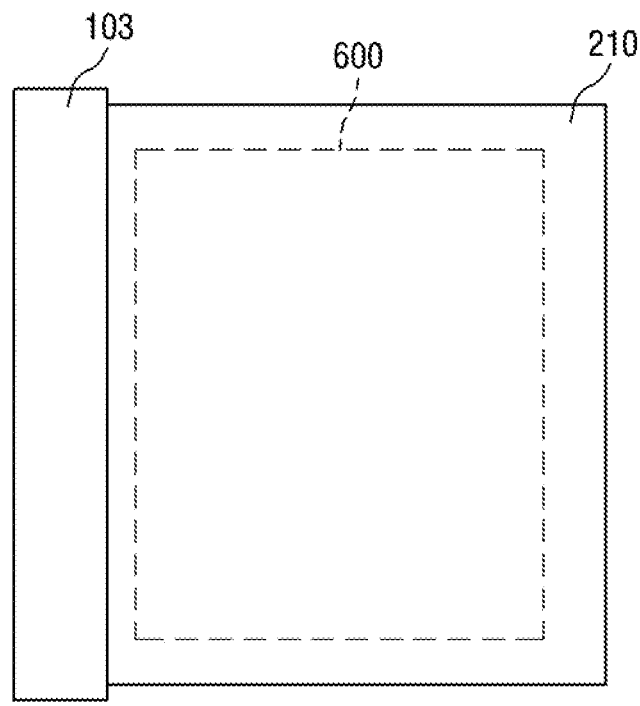
FIG. 9 is a plan view of a heating member and a donor film according to another embodiment of the present invention.

FIG. 9 is a plan view of a heating member and a donor film according to another embodiment of the present invention. The plan view is as seen from above.

Referring to FIG. 9, the heating member 103 according to the current embodiment is different from the heating member 101 of FIG. 7 in that it is bar-shaped.

If the heating member 103 is bar-shaped, it may heat a side of the donor film 210. In an example, if the donor film 210 is a quadrangle, the bar-shaped heating member 103 may heat four edges of the donor film 210. In this case, at least four processes, one for each edge, may be required, and, to perform theses processes, a laminating apparatus according to an embodiment may include a transfer member which transfers the heating member 103 and/or a rotation member which rotates the heating member 103.

Figure 10:
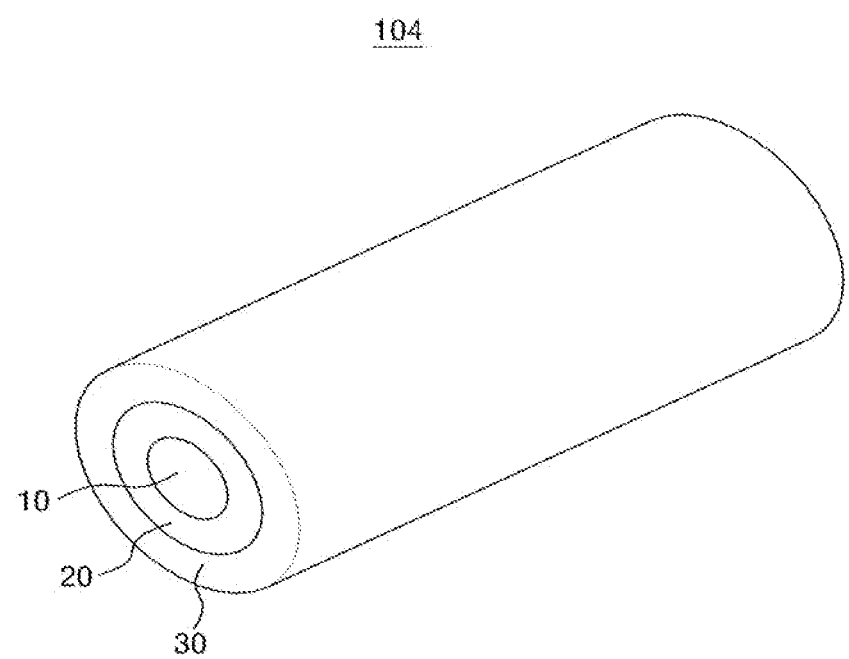
FIG. 10 is a perspective view of a heating member according to another embodiment of the present invention.

FIG. 10 is a perspective view of a heating member according to another embodiment of the present invention.

Referring to FIG. 10, the heating member according to the current embodiment is different from the heating member 100 according to the embodiment of FIG. 1 in that it is a roller.

The heating member according to the current embodiment may be a roller. For ease of description, the heating member will be referred to as a heating roller 104. Like the heating members according to other embodiments of the present invention, the heating roller 104 may include a first conducting layer 10 which receives heat from a heater, a second conducting layer 20 which overlaps the first conducting layer 10 and has a different thermal conductivity from the first conducting layer 10, and a third conducting layer 30 which overlaps the second conducting layer 20 and has a different thermal conductivity from the second conducting layer 20. In this case, the first conducting layer 10 may be disposed in an innermost part of the heating roller 103, and the third conducting layer 30 may be disposed in an outermost part of the heating roller 104.

The heater may provide heat to the heating roller 104. Specifically, the heater may provide heat to the first conducting layer 10 of the heating roller 104. The heat transfer method is not particularly limited. In an example, the heater may directly contact the first conducting layer 10 to transfer heat by conduction.

The first conducting layer 10 may transfer heat received from the heater to the second conducting layer 20. For easy heat transfer, the first conducting layer 10 may include a metal. For example, the first conducting layer 10 may include gold, silver, copper, aluminum, or stainless steel.

The second conducting layer 20 may overlap the first conducting layer 10. The second conducting layer 20 may have a different thermal conductivity from the first conducting layer 10. For example, the second conducting layer 20 may have a lower thermal conductivity than the first conducting layer 10. When heat generated by the heater is transferred to the second conducting layer 20 via the first conducting layer 10, the temperature of the second conducting layer 20 may be relatively lower than that of the first conducting layer 10.

The second conducting layer 20 may include a heat insulating material. The heat insulating material included in the second conducting layer 20 may be plastic. For example, the heat insulating material may include PEEK.

The second conducting layer 20 can be replaced by a heat insulating sheet. In a case where the second conducting layer 20 is replaced by the heat insulating sheet, the second conducting layer 20 may be thinner than the first conducting layer 10.

The third conducting layer 30 may overlap the second conducting layer 20. The third conducting layer 30 may have thermal conductivity different from that of the second conducting layer 20. For example, the thermal conductivity of the third conducting layer 30 may be higher or lower than that of the second conducting layer 20. However, the thermal conductivity of the third conducting layer 30 may be equal to that of the first conducting layer 10. That is, the first conducting layer 10 and the third conducting layer 30 may be formed of the same material.

The third conducting layer 30 may include a metal. For example, the third conducting layer 30 may include gold, silver, copper, aluminum, or stainless steel. However, the present invention is not limited thereto, and the third conducting layer 30 may also include a heat insulating material.

The heat insulating material included in the third conducting layer 30 may be plastic. For example, the heat insulating material may include PEEK.

Heat generated by the heater may be transferred to the third conducting layer 30 via the first conducting layer 10 and the second conducting layer 20. Since the heat is transferred to the third conducting layer 30 via the first conducting layer 10 and the second conducting layer 20, the temperature of the third conducting layer 30 may be relatively lower than those of the first conducting layer 10 and the second conducting layer 20.

If the third conducting layer 30 is located in the outermost part of the heating roller 104, it may contact the donor film 210. When in contact with the donor film 210, the third conducting layer 30 of the heating roller 104 may heat the donor film 210.

Figure 11:
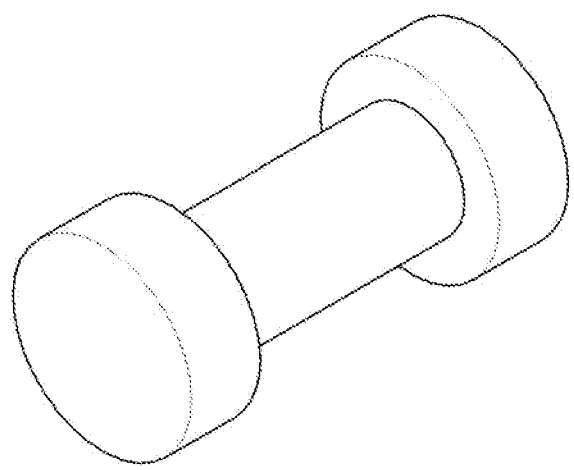
FIG. 11 is a perspective view of a heating roller according to another embodiment of the present invention.
Figure 12:
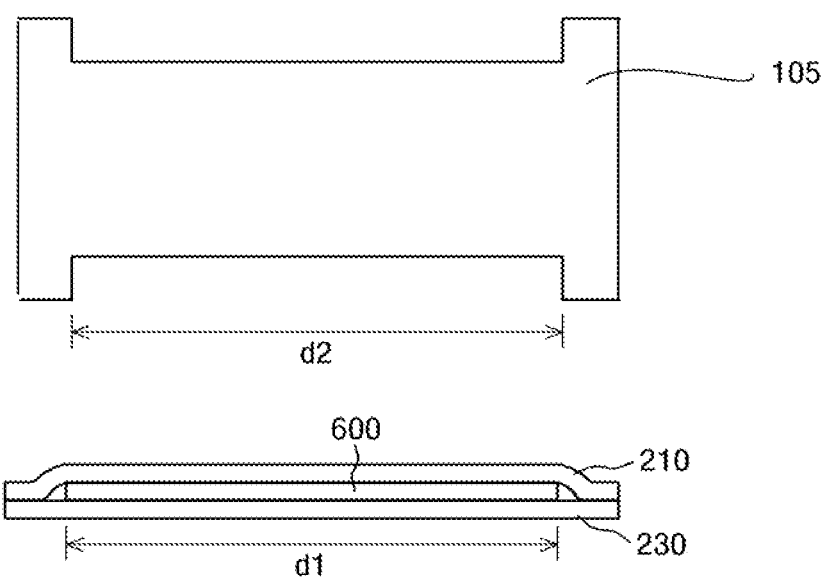
FIG. 12 is a cross-sectional view of the heating roller shown in FIG. 11.

FIG. 11 is a perspective view of a heating roller according to another embodiment of the present invention. FIG. 12 is a cross-sectional view of the heating roller shown in FIG. 11.

Referring to FIGS. 11 and 12, the heating roller 105 according to the current embodiment is different from the heating roller 104 according to the embodiment of FIG. 10 in that it has a groove recessed to a predetermined depth from an outer circumferential surface thereof.

As described above, the area of a donor film 210 according to an embodiment may be greater than that of an acceptor substrate 600. In this case, a portion of the donor film 210 along an outer circumference of the acceptor substrate 600 may not overlap the acceptor substrate 600. The portion of the donor film 210 which does not overlap the acceptor substrate 600 may contact a bottom film 230 disposed under the acceptor substrate 600. If the heating roller 105 has a groove recessed to a predetermined depth, it may heat the portion of the donor film 210 which does not overlap the acceptor substrate 600, that is, the portion of the donor film 210 which contacts the bottom film 230.

In an exemplary embodiment, a width d2 of the recessed groove in the heating roller 105 may be equal to a width d1 of the acceptor substrate 600.

The depth of the recessed groove may not be limited. In an example, only the third conducting layer 30 of FIG. 10 may be recessed, or the third conducting layer 30 and the second conducting layer 20 of FIG. 10 may be recessed. Alternatively, a portion of the third conducting layer 30 may be recessed, or a portion of the third conducting layer 30 and a portion of the second conducting layer 20 may be recessed.

A laminating apparatus according to an embodiment of the present invention may have a plurality of heating members. Embodiments of the laminating apparatus having the heating members will now be described with reference to the attached drawings.

Figure 13:
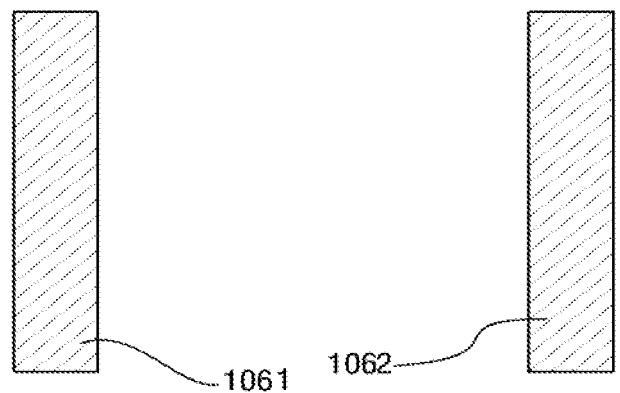
FIG. 13 is a plan view of two heating bars according to another embodiment of the present invention.

FIG. 13 is a plan view of two heating bars according to another embodiment of the present invention.

Referring to FIG. 13, a heating member 106 according to the current embodiment may include two heating bars placed parallel to each other. For ease of description, the two heating bars will be referred to as a first heating bar 1061 and a second heating bar 1062.

As described above with reference to FIG. 12, the area of a donor film 210 according to an embodiment may be greater than that of an acceptor substrate 600. In this case, a portion of the donor film 210 along an outer circumference of the acceptor substrate 600 may not overlap the acceptor substrate 600. The portion of the donor film 210 which does not overlap the acceptor substrate 600 may contact a bottom film 230 disposed under the acceptor substrate 600. If the heating member 106 of FIG. 13 has the first heating bar 1061 and the second heating bar 1062 placed parallel to each other, the first heating bar 1061 and the second heating bar 1062 may heat the portion of the donor film 210 of FIG. 12 which does not overlap the acceptor substrate 600, that is, the portion of the donor film 210 which contacts the bottom film 230.

The first heating bar 1061 and the second heating bar 1062 included in the heating member 106 may heat two sides of the donor film 210. In an exemplary embodiment, if the donor film 210 is a quadrangle, the first heating bar 1061 and the second heating bar 1062 may heat four sides of the donor film 210. That is, at least two processes, one for every two sides, may be required, and, to perform theses processes, a laminating apparatus according to an embodiment may further include a transfer member which transfers the first heating bar 1061 and the second heating bar 1062 and/or a rotation member which rotates the first heating bar 1061 and the second heating bar 1062.

Figure 14:
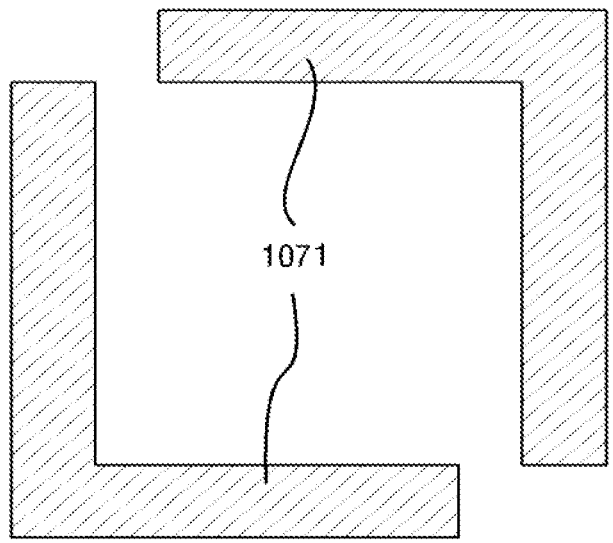
FIG. 14 is a plan view of heating bars according to another embodiment of the present invention.

FIG. 14 is a plan view of heating bars according to another embodiment of the present invention.

Referring to FIG. 14, the heating member 107 according to the current embodiment is different from the heating member 106 according to the embodiment of FIG. 13 in that it is bent in an 'L' shape.

The heating member 107 according to the current embodiment may include heating bars bent in an 'L' shape. For ease of description, the heating bars bent in an 'L' shape will be referred to as L-shaped heating bars 1071.

In an exemplary embodiment, the heating member 107 may include two L-shaped heating bars 1071. In this case, inner sides of the two L-shaped heating bars 1071 may face each other.

Each of the L-shaped heating bars 1071 included in the heating member 107 may heat two adjacent sides of a donor film 210 of FIG. 12. In an example, if the donor film 210 is a quadrangle, the heating member 107, including the two-shaped heating bars 1071 which face each other, may heat four sides of the donor film 210. In this case, the four sides of the donor film 210 can be heated simultaneously in one process.

Figure 15:
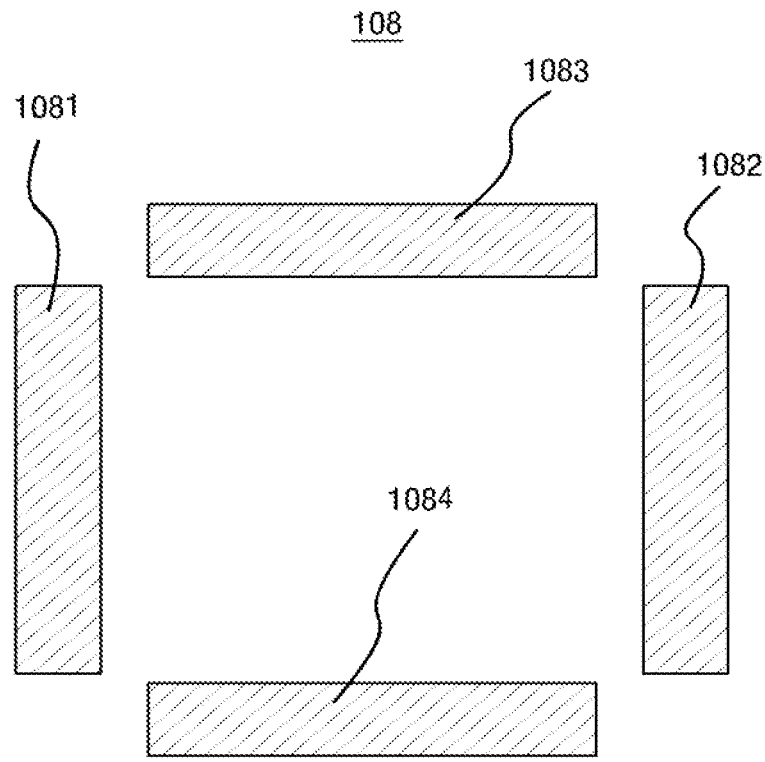
FIG. 15 is a plan view of a heating member according to another embodiment of the present invention.

FIG. 15 is a plan view of a heating member according to another embodiment of the present invention.

Referring to FIG. 15, the heating member 108 according to the current embodiment is different from the heating bar 106 according to the embodiment of FIG. 13 in that it includes four heating bars.

The heating member 108 according to the current embodiment may include four heating bars. For ease of description, the four heating bars will be referred to as a first heating bar 1081, a second heating bar 1082, a third heating bar 1083, and a fourth heating bar 1084.

In an exemplary embodiment, the first heating bar 1081 and the second heating bar 1082 may be placed parallel to each other, and the third heating bar 1083 and the fourth heating bar 1084 may be placed parallel to each other. In this case, the first heating bar 1081 and the second heating bar 1082 may be placed perpendicular to the third heating bar 1083 and the fourth heating bar 1084.

In an exemplary embodiment, if a donor film 210 of FIG. 12 is a quadrangle, the four heating bars 1081 through 1084 may heat four sides of the donor film 210, respectively. In this case, the four sides of the donor film 210 can be heated simultaneously in one process.

Figure 16:
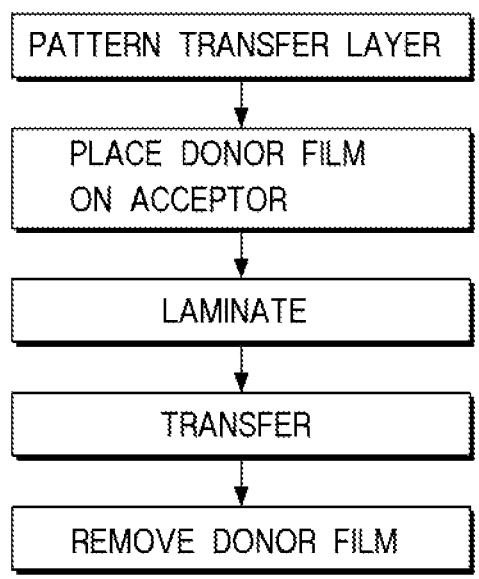
FIG. 16 is a flowchart illustrating a method of manufacturing an organic light-emitting display according to an embodiment of the present invention.

FIG. 16 is a flowchart illustrating a method of manufacturing an organic light-emitting display according to an embodiment of the present invention.

Referring to FIG. 16, the method of manufacturing an organic light-emitting display according to the current embodiment includes patterning a transfer layer of a donor film, placing the donor film on an acceptor substrate, laminating the acceptor substrate and the donor film, transferring the transfer layer of the donor film to the acceptor substrate, and removing the donor film from the acceptor substrate.

Specifically, a transfer layer 213 (see FIG. 3) of a donor film 210 is patterned. In an exemplary embodiment, the transfer layer 213 may be patterned using a laser irradiator. Since the detailed structure of the donor film 210 has been described above, a description thereof will be omitted (see FIG. 3).

After the patterning of the transfer layer 213, the donor film 210 may be placed on an acceptor substrate 600 (as seen in FIG. 12). In detail, after the donor film 210 is placed above the acceptor substrate 600 with a gap therebetween, the position of the donor film 210 may be adjusted. Then, the donor film 210 may be lowered to contact the acceptor substrate 600.

Next, the donor film 210 is laminated. The lamination process according to the current embodiment includes a process of heating the donor film 210 using a heating member 100 (as seen in FIG. 2).

The heating member 100 may include a first conducting layer 10 (see FIG. 1) which receives heat from a heater, a second conducting layer 20 which overlaps the first conducting layer 10 and which has a thermal conductivity different from that of the first conducting layer 10, and a third conducting layer 30 which overlaps the second conducting layer 20 and which has a thermal conductivity different from that of the second conducting layer 20.

Any one of the exemplary heating members 100 through 108 described above can be used in the method of manufacturing an organic light-emitting display according to the current embodiment. A detailed description of the heating members 100 through 108 described above will be omitted (see FIGS. 1 and 6 through 15).

After the donor film 210 and the acceptor substrate 600 are laminated, the transfer layer 213 of the donor film 210 may be transferred to the acceptor substrate 600. Here, the transfer layer 213 may be transferred to the acceptor substrate 600 using a laser beam. In an example, as a region of the transfer layer 213 irradiated with a laser beam is separated from the donor film 210, it may be transferred to the acceptor substrate 600.

After the transfer of the transfer layer 213, other portions of the donor film 210 excluding the transfer layer 213 are removed. If any one of the exemplary heating members 100 through 108 according to the embodiments of the present invention is used in the lamination process, the donor film 210 can be removed easily. That is, since a heating member having a multilayer structure lowers the lamination temperature, the donor film 210 can be removed without being torn out or creating cracks in the acceptor substrate 600.

Embodiments of the present invention provide at least one of the following advantages.

That is, since the lamination process is performed at a relatively low temperature, adhesion between a donor film and a bottom film can be reduced.

In addition, the donor film can be easily separated from the acceptor substrate without being torn out or creating cracks in the acceptor substrate.

Furthermore, the donor film can be separated from the acceptor substrate with improved reliability in the process of manufacturing an organic light-emitting display.

However, the effects of the present invention are not restricted to the ones set forth herein. The above and other effects of the present invention will become more apparent to one of ordinary skill in the art to which the present invention pertains by referencing the claims.

While the present invention has been particularly shown and described with reference to exemplary embodiments thereof, it will be understood by those of ordinary skill in the art that various changes in form and detail may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A laminating apparatus for laminating a donor film, the apparatus comprising:
    a heater which generates heat; and
    a heating member which transfers heat received from the heater to the donor film, wherein the heating member comprises:
        a first conducting layer which receives heat from the heater;
        a second conducting layer which is disposed on the first conducting layer and which has a thermal conductivity different from a thermal conductivity of the first conducting layer; and
        a third conducting layer which is disposed on the second conducting layer and which has a thermal conductivity different from a thermal conductivity of the second conducting layer.

2. The apparatus of claim 1, wherein the first conducting layer comprises stainless steel.

3. The apparatus of claim 1, wherein the second conducting layer comprises a heat insulating material.

4. The apparatus of claim 3, wherein the heat insulating material is polyetheretherketone (PEEK).

5. The apparatus of claim 1, wherein the third conducting layer comprises a heat insulating sheet.

6. The apparatus of claim 5, wherein the heat insulating sheet is a Teflon sheet.

7. The apparatus of claim 1, wherein the heating member is a quadrangle with a through hole.

8. The apparatus of claim 1, wherein the heating member comprises a heating bar.

9. The apparatus of claim 1, wherein the heating member comprises a heating roller.

10. A laminating apparatus for laminating a donor film, the apparatus comprising:
    a heater generating heat; and
    a plurality of heating members which are separated by a predetermined distance and which transfer heat received from the heater to the donor film,
    wherein each of the heating members comprises:
        a first conducting layer which receives heat from the heater;
        a second conducting layer which is disposed on the first conducting layer and which has a thermal conductivity different from a thermal conductivity of the first conducting layer; and
        a third conducting layer which is disposed on the second conducting layer and which has a thermal conductivity different from a thermal conductivity of the second conducting layer.

11. The apparatus of claim 10, wherein the heating members comprise a first heating bar and a second heating bar which are separated from each other by a predetermined distance.

12. The apparatus of claim 11, wherein the first heating bar and the second heating bar are bent in an 'L' shape, and inner sides of the first heating bar and the second heating bar face each other.

13. The apparatus of claim 11, wherein the first heating bar and the second heating bar are disposed parallel to each other.

14. The apparatus of claim 13, wherein the beating members further comprise a third heating bar and a fourth heating bar, the third heating bar and the fourth heating bar are separated from each other by a predetermined distance and are placed parallel with respect to each other, and the first heating bar and the second heating bar are disposed perpendicular to the third heating bar and the fourth heating bar.

15. A method of manufacturing an organic light-emitting display, the method comprising the steps of:
- patterning a transfer layer of a donor film;
- placing the donor film on an acceptor substrate which is disposed on a bottom film;
- laminating the donor film;
- transferring the transfer layer of the donor film to the acceptor substrate; and
- removing the donor film from the acceptor substrate;
- wherein the step of laminating the donor film comprises applying heat and pressure to the donor film using a heating member, wherein the heating member comprises:
  - a first conducting layer which receives heat from a heater;
  - a second conducting layer which overlaps the first conducting layer and which has a thermal conductivity different from a thermal conductivity of the first conducting layer; and
  - a third conducting layer which overlaps the second conducting layer and which has a thermal conductivity different from a thermal conductivity of the second conducting layer.

16. The method of claim 15, wherein the heating member applies heat and pressure to a portion of the donor film which contacts the bottom film.

17. The method of claim 16, wherein the heating member comprises a plurality of heating bars.

18. The method of claim 16, wherein the heating member comprises a heating roller.

19. The method of claim 16, wherein the heating member is a quadrangle with a through hole.

20. The method of claim 15, wherein the first conducting layer comprises stainless steel.

21. The method of claim 15, wherein the second conducting layer comprise a heat insulating material.

22. The method of claim 15, wherein the heat insulating material is PEEK.

23. The method of claim 15, wherein the third conducting layer is a heat insulating sheet.

24. The method of claim 23, wherein the beat insulating sheet is a Teflon sheet.

* * * * *